United States Patent
Sudjian

(10) Patent No.: US 6,211,699 B1
(45) Date of Patent: Apr. 3, 2001

(54) HIGH PERFORMANCE CML TO CMOS CONVERTER

(75) Inventor: Douglas Sudjian, Santa Clara, CA (US)

(73) Assignee: Micro Linear Corporation, San Jose, CA (US)

( * ) Notice: Subject to any disclaimer, the term of this patent is extended or adjusted under 35 U.S.C. 154(b) by 0 days.

(21) Appl. No.: 09/292,095

(22) Filed: Apr. 14, 1999

(51) Int. Cl.$^7$ .............................................. H03K 19/175
(52) U.S. Cl. ............................................... 326/66; 326/64
(58) Field of Search ................................ 326/64, 65, 66, 326/68, 70, 71, 73, 76, 77

(56) References Cited

U.S. PATENT DOCUMENTS

| | | | |
|---|---|---|---|
| 4,785,205 | | 11/1988 | Sanwo et al. .................... 307/475 |
| 4,810,908 | * | 3/1989 | Suzuki et al. .................... 326/126 |
| 4,888,501 | | 12/1989 | Sanwo et al. .................... 307/475 |
| 4,891,535 | | 1/1990 | Etheridge ........................ 307/475 |
| 5,173,624 | * | 12/1992 | Gabillard et al. ................. 326/66 |
| 5,229,658 | * | 7/1993 | Ide et al. ......................... 326/66 |
| 5,426,381 | * | 6/1995 | Flannagan et al. ............... 326/66 |
| 5,434,518 | * | 7/1995 | Sinh et al. ....................... 326/66 |
| 5,459,412 | * | 10/1995 | Mentzer ........................... 326/66 |
| 5,465,057 | * | 11/1995 | Takahashi ........................ 326/66 |
| 5,485,106 | | 1/1996 | Drost et al. ..................... 326/66 |
| 6,040,710 | * | 7/2000 | Nakauchi ......................... 326/66 |

FOREIGN PATENT DOCUMENTS

402280523A * 11/1990 (JP) .......................................... 326/64

* cited by examiner

Primary Examiner—Michael Tokar
Assistant Examiner—Steven S. Paik
(74) Attorney, Agent, or Firm—Haverstock & Owens LLP

(57) ABSTRACT

The present invention is a CML to CMOS converter which includes a bipolar input stage, a current source/current sink stage, and an output stage. The converter is able to transfer a CML input voltage differential to a CMOS compatible voltage having constant high and low voltage levels with a constant duty cycle. The bipolar input stage receives an incoming CML voltage differential and steps the voltage levels down. Utilizing the stepped down CML voltage differential, the current/source sink drives the output stage by maintaining an equal current source and current sink to and from the output stage, ensuring that an output voltage at the output stage rises and falls to constant high and low voltage levels, thereby maintaining a constant duty cycle. A first pair of NMOS transistors, coupled to the output stage drive current to the output stage from a high input voltage rail whenever the input differential is high. A first pair of PMOS transistors, coupled to the output stage sink current from the output stage to a low input voltage rail whenever the input voltage is low. The transistors are arranged and biased in order to ensure that the current sink transistors are not on as current is sourced to the output stage from the high input voltage, and the current source transistors are not on as current is sunk from the output stage to the low input voltage.

15 Claims, 9 Drawing Sheets

US 6,211,699 B1

HIGH PERFORMANCE CML TO CMOS CONVERTER

FIELD OF THE INVENTION

The present invention relates to integrated circuits which use both bipolar and CMOS logic levels. More particularly, the present invention relates to an improved high performance circuit for converting current mode logic (CML) voltage levels to CMOS compatible voltage levels.

BACKGROUND OF THE INVENTION

Integrated circuits which utilize differential bipolar current mode logic (CML) have different voltage ranges with respect to logic high and logic low voltage levels than CMOS technologies. Accordingly, the use of both bipolar and CMOS technologies in a single integrated circuit requires a conversion of current mode logic (CML) differential voltage levels to CMOS compatible voltage level converters or vice versa. For example, it is well known in the art that a typical CML circuit operates with a differential swing of two to three hundred millivolts. In contrast, a typical CMOS circuit operates according to a single ended voltage within a specified voltage range. For example, with a power supply voltage of 3.0 volts, a voltage of 2.5 V to 3.0 V represents a logic high voltage level and a voltage of 0 V to 0.5 V represents a logic low voltage level. As can be readily understood, the combination of CML and CMOS circuitry in a single integrated circuit requires a differential to single-ended conversion and a level conversion.

FIG. 1a illustrates the basic circuitry for a prior art CML to CMOS voltage converter. An incoming CML voltage signal is applied across terminals A and AN, with A representing the non-inverted voltage signal and AN representing the inverted voltage signal. The terminal A is coupled to the base of a first npn bipolar junction transistor QN1. The collector of the transistor QN1 is coupled to a first terminal of a resistor R10. A second terminal of the resistor R10 is coupled to a high voltage supply Vcc. The emitter of the transistor QN1 is coupled to the emitter of a second npn bipolar junction transistor QN2. The emitters of each of the transistors QN1 and QN2 are coupled to a low voltage supply Vss through a first current source $I_{S1}$. Preferably, the current source $I_{S1}$, is comprised of a NMOS transistor N100 which is driven by a biasing voltage, $V_{BIAS}$, coupled to the gate of the NMOS transistor N100. The base of the transistor QN2 is coupled to the terminal AN, while the collector of the transistor QN2 is coupled to a first terminal of a resistor R20. A second terminal of the resistor R20 is coupled to the high voltage supply Vcc. The base of a third npn bipolar junction transistor QN3 is also coupled to the first terminal of the resistor R20 and to the collector of the transistor QN2. The collector of the transistor QN3 is coupled to the high voltage supply Vcc, while the emitter of the transistor QN3 is coupled to the source of a first PMOS transistor T10 and the source of a second PMOS transistor T20. The drain of the first PMOS transistor T10 is coupled to the gate of the first PMOS transistor T10 and the gate of a third PMOS transistor T30. The drain of the first PMOS transistor T10 is further coupled to the low voltage supply Vss, through a second current source, $I_{S2}$. The second current source $I_2$ is comprised of an NMOS transistor N200 which is driven by the biasing voltage, VBIAS, which is coupled to the gate of the NMOS transistor N200. The drain of the second PMOS transistor T20 is coupled to an output node B. The gate of the second PMOS transistor T20 is coupled to the gate of a fourth PMOS transistor T40 and the drain of the fourth PMOS transistor T40. The drain of the fourth PMOS transistor T40 is coupled to the low voltage supply Vss through a third current source, $I_{S3}$. The third current source $I_3$ is comprised of an NMOS transistor N300 which is driven by the biasing voltage $V_{BIAS}$, coupled to the gate of the NMOS transistor N300. The source of the fourth PMOS transistor T40 is coupled to the emitter of a fourth npn bipolar junction transistor QN4. The collector of the transistor QN4 is coupled to the high voltage supply Vcc. The base of the transistor QN4 is coupled to the collector of the transistor QN1 and the first terminal of the resistor R10. The source of the third PMOS transistor T30 is also coupled to the emitter of the fourth bipolar junction transistor QN4. The drain of the third PMOS transistor T30 is coupled to the drain and the gate of a first NMOS transistor N10 and the gate of a second NMOS transistor N20. The source of the first NMOS transistor N10 and the source of the second NMOS transistor N20 are each coupled to the low voltage supply Vss. The drain of the second NMOS transistor N20 is coupled to the output node B. The output node B drives a CMOS buffer $V_{10}$.

The internal circuitry of the CMOS buffer $V_{10}$ is depicted in FIG. 1b. As shown in FIG. 1b, the CMOS buffer $V_{10}$ includes a PMOS transistor P1 having a source connected to the high voltage supply Vcc, a gate coupled to the output node B and a drain coupled to an output node Q. The CMOS buffer $V_{10}$ further includes an NMOS transistor N1 having a drain which is coupled to the output node Q. The gate of the NMOS transistor N1 is coupled to the output node B and the source of the NMOS transistor N1 is coupled to the low voltage supply Vss.

Referring again to FIG. 1a, when the differential voltage signal at the terminals A and AN is configured such that A is higher than AN, the transistor QN1 is turned on, while the transistor QN2 is off. In this state, an output voltage level measured at the output node B is switched toward the low voltage level Vss. The output voltage at the node B falls to very nearly the level of Vss when the transistor N20 sinks current out of the node B. As the voltage signal at the terminal A becomes inactive and the voltage signal at the terminal AN goes active, the output voltage at the output node B switches and begins to increase toward the high voltage level Vcc. However, due to the voltage drop associated with the bipolar junction transistors QN3, the voltage at the output node B will not reach the same voltage level as Vcc; but, rather, will actually only rise to the level of Vcc less one $V_{BE}$ voltage level of the transistor QN3 and the drain to source saturation voltage level of the transistor T20. Typically, this voltage may be as high as 0.8–1.0 volts, depending upon the operating conditions. Because the voltage at the output node B can fall to very nearly the level of Vss, but cannot rise to very nearly the level of Vcc, the voltage level at the output node B will not vary symmetrically with respect to the supply rails Vcc and Vss. This results in different rise and fall times for the voltage at the output Q of the CMOS buffer $V_{10}$ because the input threshold of the CMOS buffer $V_{10}$ is centered about ½Vcc.

Consider now the CMOS buffer of FIG. 1b. Ideally, when the NMOS transistor N1 is on, the PMOS transistor P1 should be off, and the voltage at the output Q will be driven low toward Vss. Conversely, when the PMOS transistor P1 is on, the NMOS transistor N1 should be off, and the voltage at the output Q will be driven high toward Vss. However, if the voltage at the node B is not driven high enough, the PMOS transistor P1 will not be completely turned off when the NMOS transistor N1 is on. In these circumstances, current will continue to flow through P1 to the output Q as current is drawn from the output Q through the NMOS transistor N1. Under these circumstances, the fall time required for the voltage level at the output Q to reach Vss will take longer than the rise time required for the voltage level at the output Q to reach Vcc. Accordingly, the voltage at the output Q will have an unsymmetrical duty cycle.

When such a prior art CML to CMOS converter is utilized for converting a clock signal from CML to CMOS, the converted clock signal will not have a constant duty cycle since the rise time and fall time will differ. This is undesirable in critical CMOS applications where a symmetric duty cycle is needed.

Additionally, it may be desirable to have both a CMOS output signal and its inverted complement, that are matched and track each other over process and temperature variations. In prior art CML to CMOS converters, the complement of the output voltage is often generated by using a CMOS inverter and simply inverting the output. One problem with such a method is the association of a delay with the inverter. In such cases, the complement will not be in synch with the uncomplemented output voltage; but, instead, will be delayed by a small fraction of time associated with the inverter. In many critical applications, such as the generation of CMOS compatible clocking signals, this delay in time is unacceptable. This problem has been overcome in the past by inverting the output voltage twice (in parallel with an inverter used for the complement) in order to obtain a new output voltage having the same frequency and period of the original output voltage.

FIG. 2 illustrates a prior art method for generating an inverted or complementary output signal. As shown, a CML signal is input to a CML to CMOS converter 500 at the input terminal I. A CMOS signal is output from the converter 500 at the output terminal OUT. The output terminal OUT is coupled to a first inverter $X_1$ and a second inverter $X_2$. The output from the first inverter $X_1$ is input to a third inverter $X_3$. The output from the second inverter $X_2$ is the inverted or complementary output signal NOUT, while the output from the third inverter $X_3$ is the original output signal. Each of the inverters $X_1$, $X_2$, and $X_3$ has an associated timing delay, with the inverter $X_1$ having a delay of $T_1$, the inverter $X_2$ having a delay of $T_2$, and the inverter $X_3$ having a delay of $T_3$. As described above, in prior art configurations the inverters $X_1$, $X_2$, and $X_3$ are each chosen such that the sum of the delays for the first and third inverters $T_1+T_3$ is approximately equal to the delay of the second inverter $T_2$. In this way, the output signal OUT and the inverted or complementary output signal are in synch. However, such circuitry is often complicated and difficult to design and the delays may vary under differing operating conditions such that obtaining optimized synchronization is extremely difficult. Delay matching involved adjusting the geometries of CMOS gate width and length to control delay of one signal with respect to another. Process variations, such as threshold voltage over temperature, do not make this an optimized solution for critical timing applications.

Accordingly, what is needed is an improved design which allows the converter to reach the desired high output voltage level required for CMOS circuitry so as to maintain a relatively constant duty cycle. What is further needed is a CML to CMOS converter which can output both the CMOS signal and its inverted complement, without any delay between the two voltage signals such that both signals are in synch without the need for complicated circuitry.

SUMMARY OF THE INVENTION

The present invention is a current mode logic (CML) to CMOS converter which includes a differential bipolar CML input stage, a current source/current sink stage, and an output stage. The converter is able to convert a CML input voltage differential to a CMOS compatible voltage signal having high and low voltage levels which are symmetric with respect to supply rails. This enables the CML to CMOS converter to form an output signal having a constant duty cycle when a clock signal is applied to the converter. The bipolar input stage receives an incoming CML voltage differential signal and adjusts the relative voltage levels, increasing the high and decreasing the low voltage levels, thereby creating a greater swing between voltage levels. Utilizing the adjusted CML voltage differential signal, the current source/current sink stage drives the output stage by maintaining equal current source and current sink levels to and from the output stage, ensuring that the output voltage rises and falls symmetrically to the supply high and low voltage levels, thereby maintaining a constant duty cycle.

A first pair of NMOS transistors, coupled to the output stage through a set of PMOS transistors make up the current source and drive current to the output stage from a high input voltage rail whenever the input differential is logic zero or negative. A first pair of PMOS transistors, coupled to the output stage through a set of NMOS transistors make up the current sink and draw current from the input capacitance of the first output buffer/inverter stage thus driving this node to a low input voltage rail whenever the input differential voltage is positive. The transistors are arranged and biased in order to ensure that the current sink transistors are never on as current is sourced to the output stage from the high input voltage rail. Conversely, the current source transistors are never on as current is sunk from the output stage to the low input voltage rail. In addition, the current source is configured to drive a level of current that is substantially equal to a level of current that the current sink draws from the output stage. Therefore, the output signal has substantially equal rise and fall times.

DETAILED DESCRIPTION OF THE PREFERRED EMBODIMENT

The present invention is a current mode logic (CML) to CMOS converter which includes a differential bipolar CML input stage, a current pump (a current source/sink stage), and an output stage. The converter is able to convert a differential CML input signal to a CMOS compatible voltage signal having high and low voltage levels which are symmetric with respect to high and low voltage supply rails to enable the CML to CMOS converter to form an output signal having a constant duty cycle when the converter is driven by a constant duty cycle input signal. The bipolar input stage receives an incoming differential CML signal and steps the voltage levels up, by decreasing the low voltage levels, thereby creating a voltage signal having a greater swing between the high and low levels. Utilizing this converted voltage signal, the current source/sink stage drives the output stage by maintaining an equal current source and current sink to and from the output stage, ensuring that an internal node voltage driving the CMOS buffer output stage rises and falls symmetrically relative to the supply levels, thereby maintaining a constant duty cycle.

The current pump includes a current source circuit and a current sink circuit for driving current to and drawing current from the output stage, respectively. A first pair of source coupled NMOS transistors, coupled to the output stage through a set of two PMOS transistors, source current to the output stage from a high input voltage rail whenever the differential input voltage signal is negative. A first pair of source coupled PMOS transistors, coupled to the output stage through a set of two NMOS transistors, sink current from the output stage to a low input voltage rail whenever the differential input voltage signal is positive. The transistors are arranged and biased in order to ensure that the current sink transistors are never on as current is sourced to the output stage from the high input voltage rail. Conversely, the current source transistors are never on as current is sunk from the output stage to the low input voltage rail.

Figure 1A:
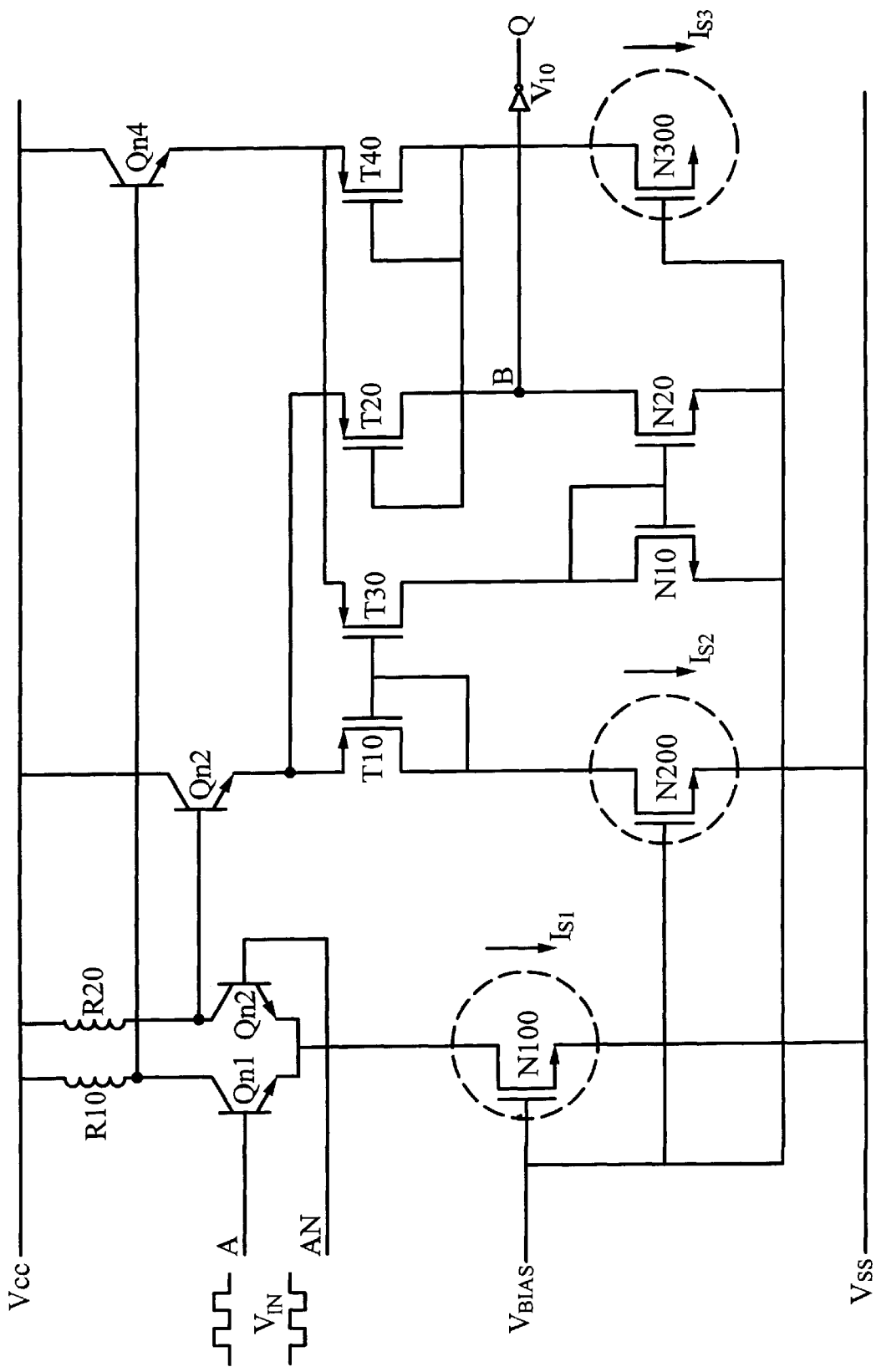
FIG. 1a illustrates a schematic diagram of a prior art CML to CMOS converter.
Figure 1B:
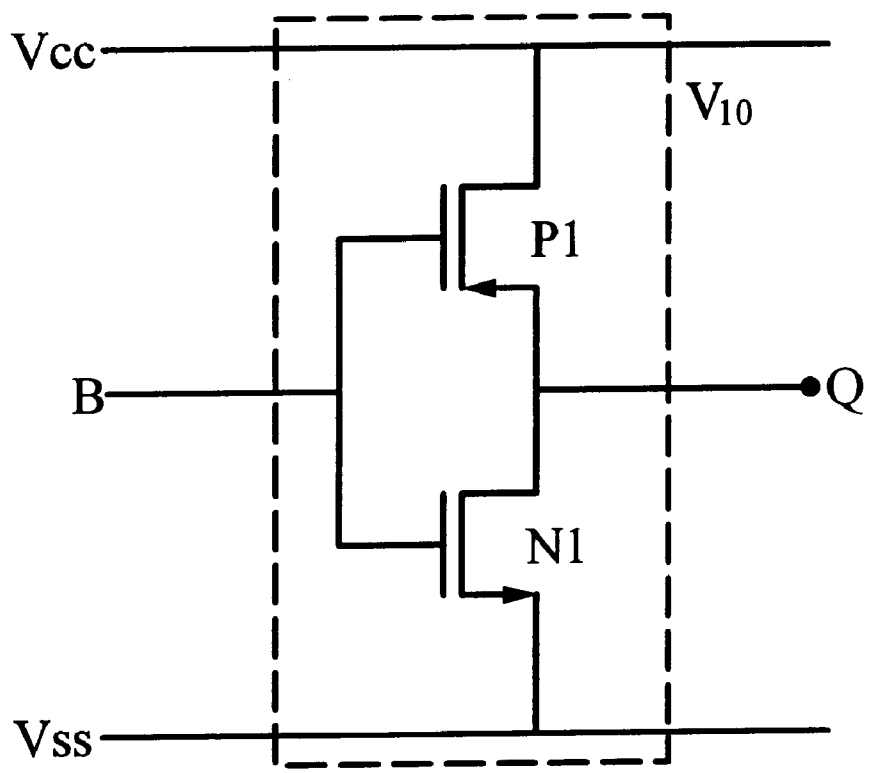
FIG. 1b illustrates a schematic diagram of the CMOS buffer of FIG. 1.
Figure 2:
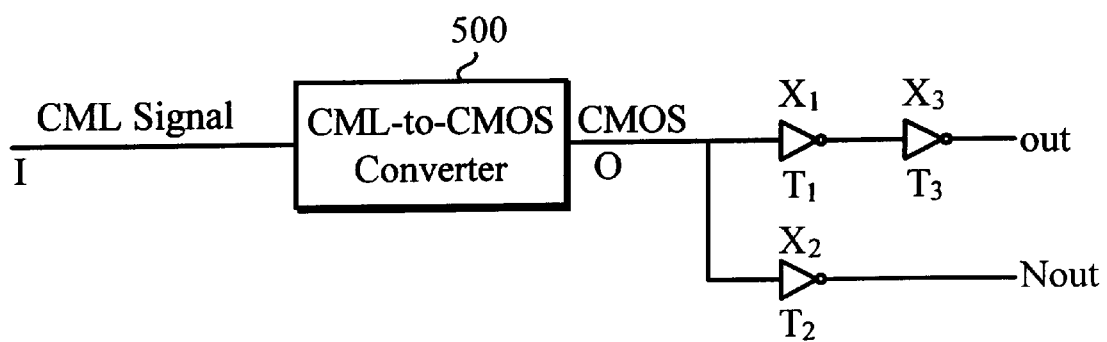
FIG. 2 illustrates a schematic diagram of a prior art circuit for generating an inverted output signal.
Figure 3:
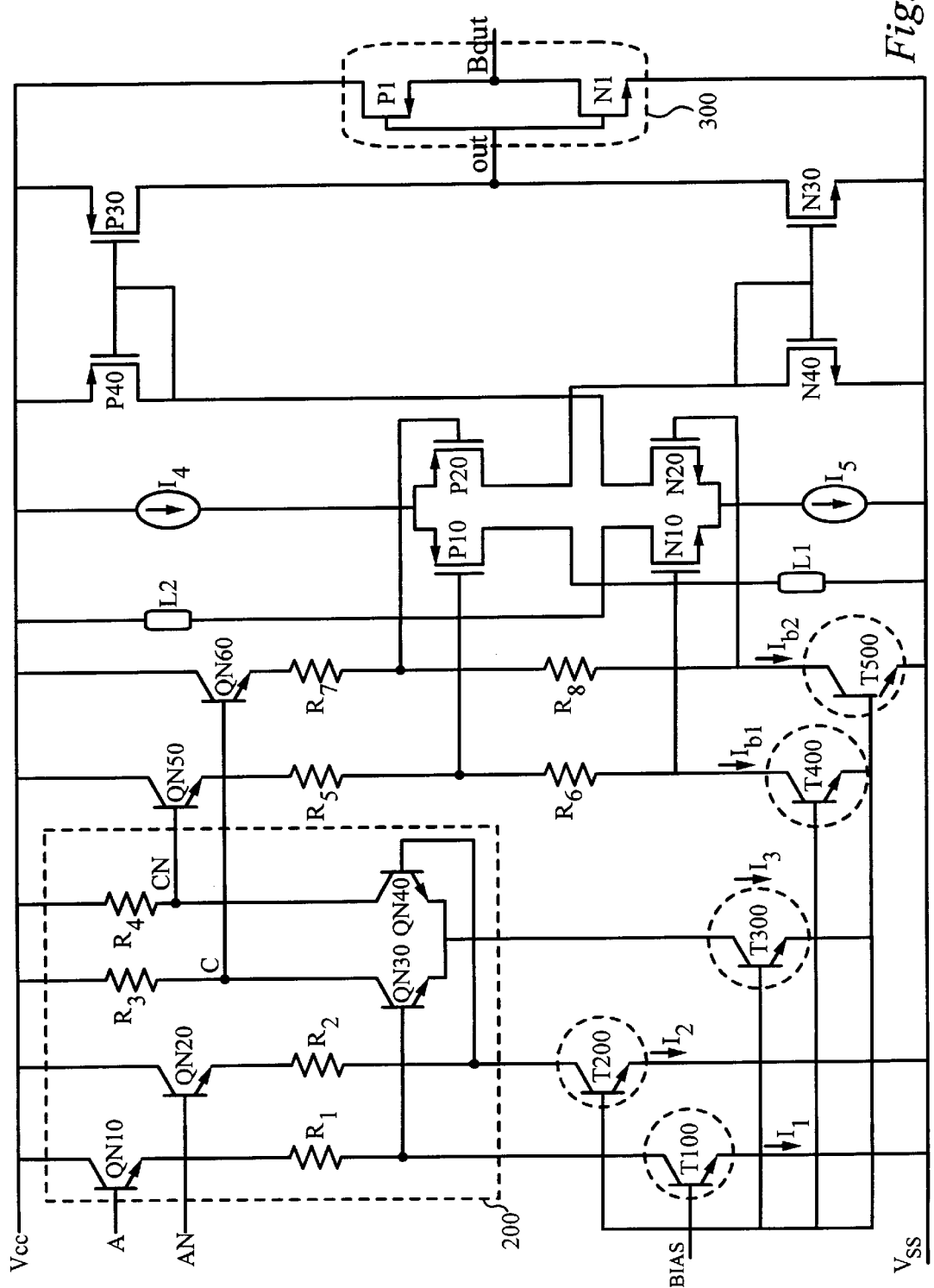
FIG. 3 illustrates a schematic diagram of a CML to CMOS converter of the present invention.

FIG. 3 illustrates a schematic diagram of a preferred embodiment of the CML to CMOS converter of the present invention. As shown, a differential CML voltage signal is applied across complementary input terminals A and AN to the converter of the present invention, where the voltage signal at the terminal A represents the positive voltage signal and the voltage signal at the terminal AN represents the complement or inverted voltage signal. The terminal A is coupled to the base of a first npn bipolar junction transistor QN10, while the terminal AN is coupled to the base of a second npn bipolar junction transistor QN20. The collector of the transistor QN10 and the collector of the transistor QN20 are both coupled to a high voltage supply Vcc. The emitter of the transistor QN10 is coupled to a first terminal of a resistor R1. A second terminal of the resistor R1 is coupled to the base of a third npn bipolar junction transistor QN30, which is part of a first differential pair of transistors, and to a low voltage supply Vss through a first current source, $I_1$. The first current source $I_1$ preferably includes an npn bipolar junction transistor T100 which is driven by a biasing voltage $V_{BIAS}$ coupled to the base of the transistor T100.

The emitter of the transistor QN20 is coupled to a first terminal of a resistor R2. A second terminal of the resistor R2 is coupled to the base of fourth npn bipolar junction transistor QN40, which is also part of the first differential pair of transistors, and to the low input voltage supply Vss through a second current source, $I_2$. The second current source $I_2$ preferably includes an npn bipolar junction transistor T200 which is driven by the biasing voltage $V_{BIAS}$ coupled to the base of the transistor T200. The emitters of the first differential pair of transistors QN30 and QN40 are coupled together and tied to the low voltage supply Vss through a third current source, $I_3$. The third current source $I_3$ preferably includes an npn bipolar junction transistor T300 which is driven by the biasing voltage $V_{BIAS}$ coupled to the base of the transistor T300. The collectors of each transistor QN30 and QN40 in the first differential pair are both coupled to the high voltage supply Vcc. The collector of the transistor QN30 is coupled to the high voltage supply Vcc through a first node C and a resistor R3, while the collector of the transistor QN40 is coupled to the high voltage supply Vcc through a second node CN and a resistor R4. Together, the components QN10, QN20, QN30, QN40, QN50, QN60, R1, R2, R3, R4, R5 and R7 make up a bipolar input stage 200.

In operation, when the incoming voltage signal at the terminal A is higher than the incoming voltage signal at the terminal AN, the transistors QN10, QN20 and QN30 are turned on and the transistor QN40 is turned off. In this state, the voltage at the node C is driven low, while the voltage at the node CN is driven high. Conversely, when the incoming voltage signal at the terminal A is lower than the incoming voltage signal at the terminal AN, the transistor QN30 is turned off and the transistors QN10, QN20 and QN40 are turned on. In this state, the voltage at the node C is driven high, while the voltage at the node CN is driven low. Accordingly, the bipolar input stage converts the differential incoming current mode signal at the terminals A and AN to a voltage signal having minimum and maximum voltages levels corresponding to the high input supply Vcc and a voltage lower than Vcc set by the current source $I_3$ and one of the resistors R3 or R4. The transistors QN10 and QN20 are always biased to be turned on as these transistors only function as buffers/level shifters.

Referring again to FIG. 3, the base of a fifth npn bipolar junction transistor QN50 is coupled to the node CN, while the base of a sixth npn bipolar junction transistor QN60 is coupled to the node C. The collectors of each of the transistors QN50 and QN60 are coupled to the high voltage supply Vcc. The emitter of the transistor QN50 is coupled to a first terminal of a resistor R5. A second terminal of the resistor R5 is coupled to the gate of a PMOS transistor P10, and the first terminal of a resistor R6. A second terminal of the resistor R6 is coupled to the gate of an NMOS transistor N10 and to the low voltage supply Vss through a current source $I_{b1}$. The current source $I_{b1}$ preferably includes a bipolar junction transistor T400 which is driven by the constant voltage $V_{BIAS}$ coupled to the base of the transistor T400. The emitter of the transistor QN60 is coupled to a first terminal of a resistor R7. A second terminal of the resistor R7 is coupled to the gate of a PMOS transistor P20 and the first terminal of a resistor R8. A second terminal of the resistor R8 is coupled to the gate of an NMOS transistor N20 and to the low voltage supply Vss through a current source $I_{b2}$. The current source $I_{b2}$ preferably includes a bipolar junction transistor T500 which is driven by the constant voltage $V_{BIAS}$ coupled to the base of the transistor.

The source of the PMOS transistor P10 and the source of the PMOS transistor P20 are both coupled to the high voltage supply Vcc through a fourth current source, $I_4$. The drain of the PMOS transistor P10 is coupled to the low voltage supply Vss through a dummy load L1. The drain of the PMOS transistor P20 is coupled to the drain of an NMOS transistor N40, the gate of the NMOS transistor N40 and the gate of an NMOS transistor N30. The source of the NMOS transistor N30 and the source of the NMOS transistor N40 are both coupled to the low voltage supply Vss. The drain of the transistor N30 is coupled to an output node OUT. The current from the current source $I_4$ either flows through the PMOS transistor P20 and then through the NMOS transistor N40 or through the PMOS transistor P10 and the dummy load Li. Because the NMOS transistors N40 and N30 are configured as a current mirror, when the current from the current source $I_4$ is directed through the NMOS transistor N40, the NMOS transistor N30 attempts to mirror and sink the same level of current from the output node OUT. Together, the four transistors P10, P20, N30 and N40 form a current sink circuit, which when activated draws current from the output node OUT, thereby decreasing a voltage level at the output node OUT.

The source of the NMOS transistor N10 and the source of the NMOS transistor N20 are both coupled together and tied to the low voltage supply Vss through a fifth current source, $I_5$. The drain of the NMOS transistor N10 is coupled to the high voltage supply Vcc through a dummy load L2. The drain of the NMOS transistor N20 is coupled to the drain of a PMOS transistor P40, the gate of the PMOS transistor P40, and the gate of a PMOS transistor P30. The source of the PMOS transistor P30 and the source of the PMOS transistor P40 are both coupled to the high voltage supply Vcc. The drain of the PMOS transistor P30 is coupled to the output node OUT. The current from the current source $I_5$ either flows through the NMOS transistor N20 and the PMOS transistor P40 or through the NMOS transistor N10 and the dummy load L2. Because the PMOS transistors P40 and P30 are configured as a current mirror, when the current for the current source $I_5$ is drawn from the PMOS transistor P40 the PMOS transistor P30 attempts to source the same level of current to the output node OUT. Together, the four transistors N10, N20, P30 and P40 form a current source circuit, which when activated supplies current to the output node OUT, thereby increasing a voltage level at the output node OUT.

The output node OUT is coupled to a CMOS buffer 300 which includes a single PMOS transistor P1 and a single NMOS transistor N1. The output node OUT is coupled to the gates of the PMOS transistor P1 and the NMOS transistor N1. The source of the PMOS transistor P1 is coupled to the high voltage supply Vcc, while the source of the NMOS transistor N1 is coupled to the low voltage supply Vss. The drains of the PMOS transistor P1 and the NMOS transistor N1 are coupled together, thereby forming a buffered output node BOUT. Preferably this first input stage is designed to minimize the input capacitance seen at the node OUT by the current source and sink transistors P30 and N30, respectively, This is achieved by using minimum MOS device geometries if possible. Preferably, the turn-on/turn-off or threshold voltage required to activate each of the transistors P1 and N1 is equal to approximately one half of the high voltage supply Vcc. It will be apparent that additional CMOS buffers used in series may be utilized to help square off transitions in the voltage level at the output node OUT.

In operation, when the voltage at the node C is high and the voltage at the node CN is low (as discussed earlier, this occurs when the incoming voltage signal at terminal A is low and the signal at terminal AN is high), the transistors QN60 and QN50 provide a voltage level shifting function through the resistors R5 and R6 or through the resistors R7 and R8 to the gates of the PMOS transistors P10 and P20 and the NMOS transistors N10 and N20. In this state, the voltage at the gate of the PMOS transistor P20 increases while the voltage at the gate of the PMOS transistor P10 decreases. This turns the transistor P20 off, and turns the transistor P10 on. Concurrently, the voltage at the gate of the NMOS transistor N20 increases, while the voltage at the gate of the NMOS transistor N10 is decreased. This causes the NMOS transistor N10 to turn off, while the NMOS transistor N20 turns on. As the NMOS transistor N20 draws more current down from the high voltage supply Vcc, the voltage at the gates of the PMOS transistors P30 and P40 begins to decrease, activating the PMOS transistors P40 and P30. As the PMOS transistor P30 is activated, current is sourced down from the high input voltage source Vcc to the output node OUT, thereby causing a voltage level measured at the output node OUT to increase in a predetermined manner.

Conversely, when the voltage at the node C is low and the voltage at the node CN is high (as discussed earlier, this occurs when the incoming voltage signal at the terminal A is high and the voltage signal at the terminal AN is low), the transistors QN50 and QN60 provide a level shifting function through the resistors R5 and R6 or through the resistors R7 and R8 to the gates of the PMOS transistors P10 and P20 and the NMOS transistors N10 and N20. In this state, the voltage at the gate of the PMOS transistor P10 is increased, while the voltage at the gate of the PMOS transistor P20 is decreased. As the voltage at the gate of the PMOS transistor P10 is increased, the transistor P10 shuts off. Meanwhile, as the voltage at the gate of the PMOS transistor P20 is decreased, it becomes more active, drawing more current from the high voltage supply Vcc. As the PMOS transistor P20 draws more current from the high voltage supply Vcc, the voltage at the gates of the NMOS transistors N30 and N40 increases until the NMOS transistor N30 becomes active. Because the voltage at the gate of the NMOS transistor N10 is greater than the voltage at the gate of the NMOS transistor N20, the transistor N10 is conducting while the transistor N20 is turned off. As this occurs, the NMOS transistor N10 draws more current down from the high voltage supply Vcc through the dummy load L2 to the low voltage supply Vss. Meanwhile, as the voltage at the base of the NMOS transistor N20 decreases, the transistor N20 draws less current from the high voltage supply Vcc and the PMOS transistor P30 turns off. As this occurs, the PMOS transistors P30 and P40 turn off. With the PMOS transistor P30 off, and the NMOS transistor N30 active, the voltage at the output node OUT begins to drop as the NMOS transistor N30 sinks current from the output node OUT to the low input voltage source Vss.

The dummy load L1 is designed to match the impedance of the NMOS transistors N30 and N40 in order to ensure that the current source capability of PMOS differential pair P10/P20 remains constant as the transistors P10 and P20 cross through their common switch point thereby ensuring a more stable current sink circuit operation. The differential switch point is when differential voltage at the respective gates of the transistors P10 and P20 equals zero. The differential capacitance seen by both is balanced. The dummy load L2 is designed to match the impedance of the PMOS transistors P30 and P40 in order to ensure that the current source $I_5$ remains constant whether the NMOS transistor N10 or the NMOS transistor N20 is on, thereby ensuring a more stable current source circuit operation.

As explained earlier, the PMOS transistor pair P10 and P20, along with the NMOS transistors N30 and N40 form a current sink circuit, drawing current from the output node OUT to the low input voltage source Vss, thereby causing the voltage level to decrease. Furthermore, the NMOS transistor pair N10 and N20, along with the PMOS transistors P30 and P40 form a current source circuit, which when activated sends current from the high input voltage source Vcc through the output node OUT, thereby increasing the voltage level at the output node OUT. The PMOS and NMOS transistors for the current sink circuit and the current source circuit are each arranged and biased in order to sink and source an equal amount of current to the output node OUT, such that the rate of change of voltage rise and drop at the output node OUT remains controlled. Moreover, the current source circuit and current sink circuit ensure that the voltage at the output node VOUT drives the CMOS buffer 300 properly such that when the PMOS transistor P1 of the CMOS buffer 300 is on, the NMOS transistor N1 of the CMOS buffer 300 is off, and when the NMOS transistor N1 of the CMOS buffer 300 is on, the PMOS transistor P1 of the CMOS buffer 300 is off. In this way, the CML to CMOS converter of the present invention produces an output voltage signal having a stable duty cycle.

Figure 4:
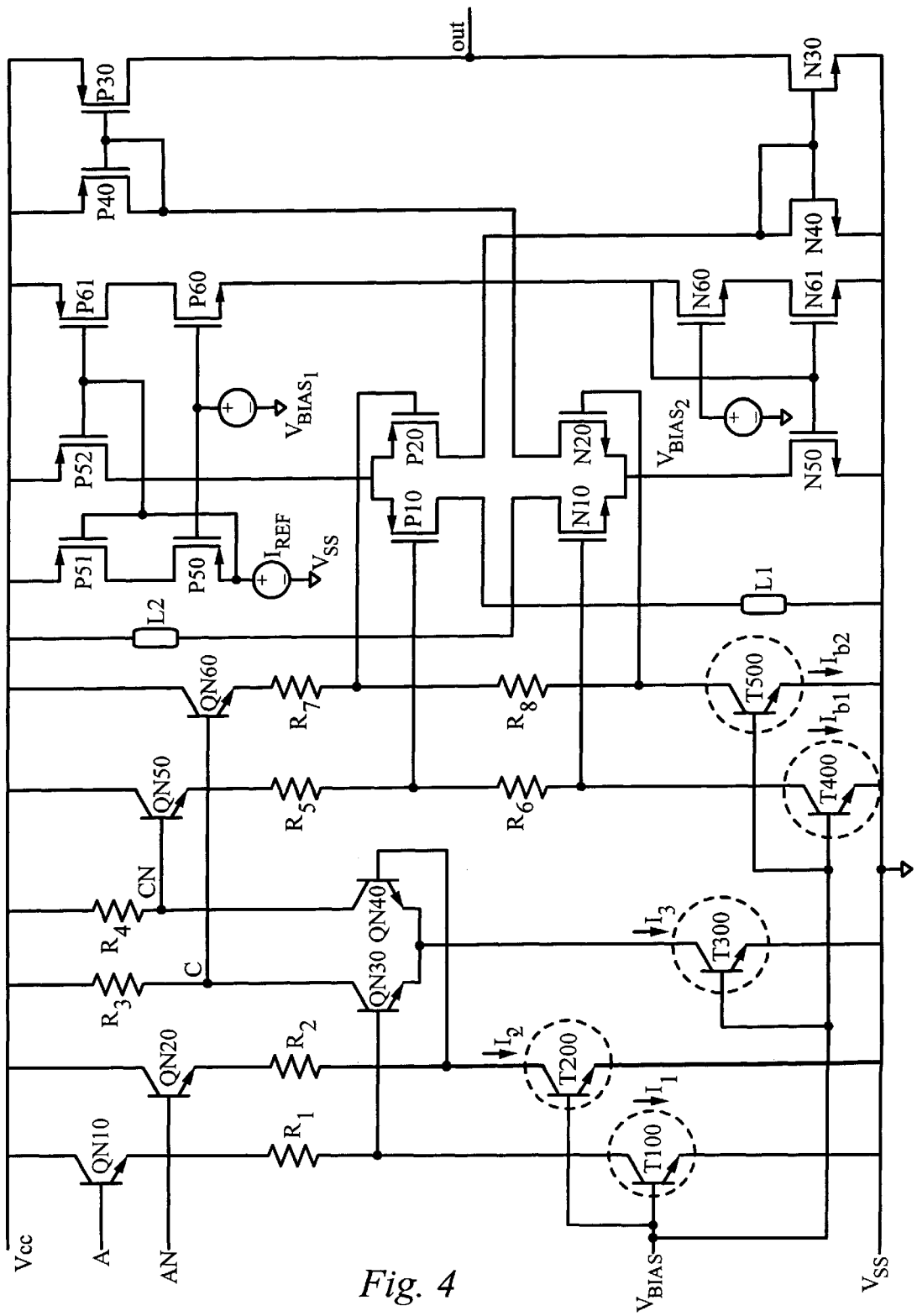
FIG. 4 illustrates a schematic diagram of a first alternative embodiment of a CML to CMOS converter of the present invention having a cascode current source arrangement.

As shown, FIG. 4 is identical to the diagram of FIG. 3 except that the current source $I_4$ is replaced with a cascode current source arrangement including PMOS transistors P50, P51, P52, P60 and P61 and a current source $I_{REF}$. In addition, the current source $1_5$ is replaced with a cascode current source arrangement including NMOS transistors N50, N60 and N61. More particularly, the sources of the transistors P10, P20 are coupled to the drain of the PMOS transistor P52. The source of the PMOS transistor P50 is coupled to the drain of the PMOS transistor P51. The drain of the PMOS transistor P50 is coupled to first terminal of current source $I_{REF}$ and to the gates of the PMOS transistors P51, P52 and P61. A second terminal of the current source $I_{REF}$ is coupled to the low voltage supply Vss. The source of the PMOS transistor P60 is coupled to the drain of the PMOS transistor P61. The gates of the PMOS transistors P50 and P60 are coupled to receive a bias voltage $V_{BIAS1}$. The drains of the PMOS transistors P51, P52 and P61 are coupled to the high voltage supply Vcc.

Additionally, the sources of the NMOS transistors N10, N20 are coupled to the drain of the NMOS transistor N50. The gate of the NMOS transistor N60 is coupled to receive a bias voltage $V_{BIAS2}$. The source of the NMOS transistor N60 is coupled to the drain of the NMOS transistor N61. The sources of the NMOS transistors N50 and N61 are coupled to the low voltage supply Vss. The drain of the PMOS transistor P60 is coupled to the drain of the NMOS transistor N60 and to the gates of the NMOS transistors N50 and N60.

The use of these cascoded transistor arrangements for the current sources $I_4$, $I_5$ aids in forming constant and equal current flows to the transistors P10, P20 and from the transistors N10, N20.

Figure 5:
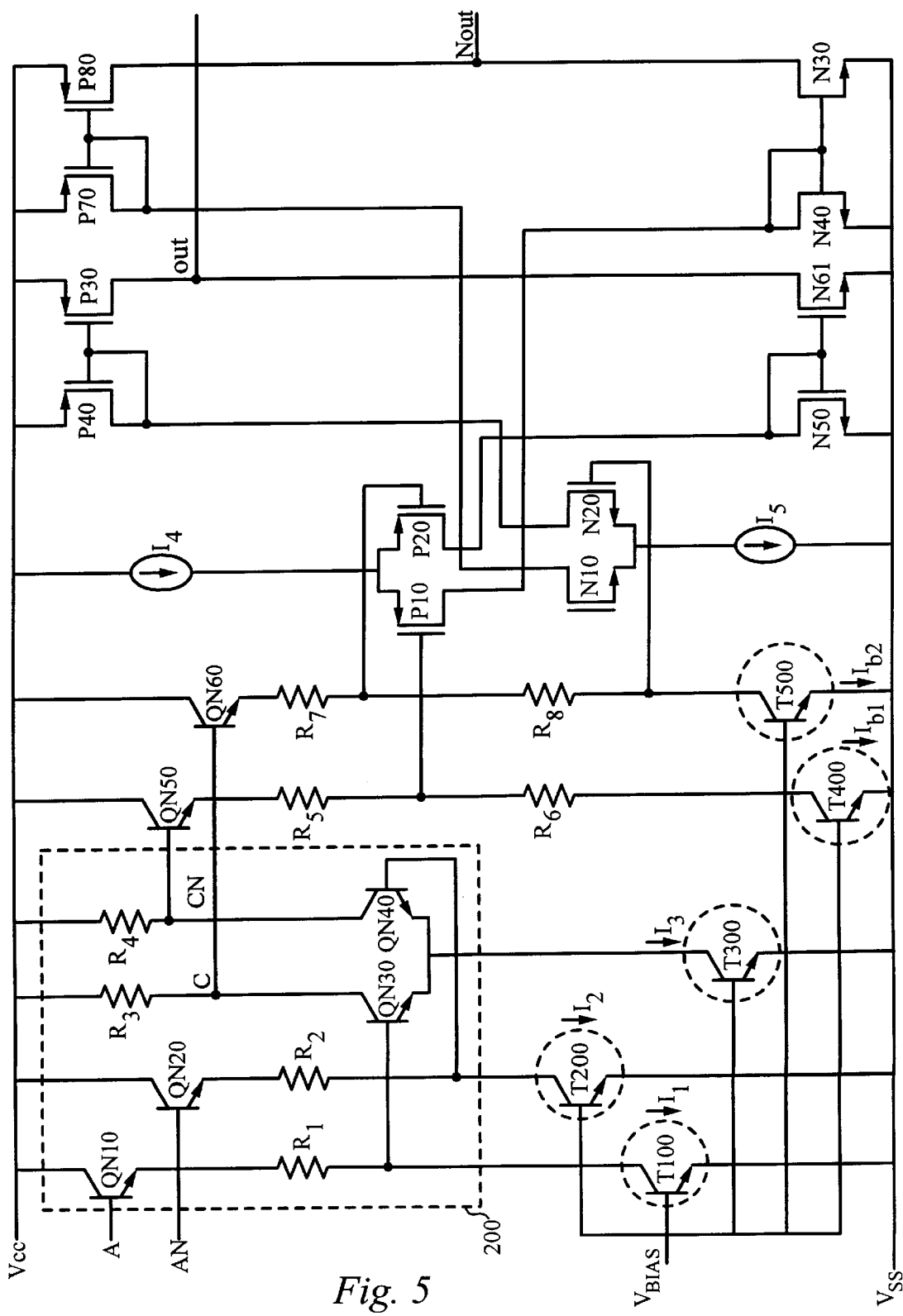
FIG. 5 illustrates a schematic diagram of a second alternative embodiment of the CML to CMOS converter of the present invention having a complementary outputs.

In many applications, it is desirable to have both an output voltage signal and its inverted complement. Accordingly, the present invention may be configured to provide both an original output voltage and an inverted complement, both of which are in synch. FIG. 5 illustrates an additional alternative embodiment of the CML to CMOS converter of the present invention which may be used to provide both an original CMOS level output voltage and its inverted complement. For simplification, the same reference symbols and numbers are used where appropriate in labeling the circuit components as those used in FIG. 3.

As shown in FIG. 5, a differential voltage in the form of complementary signals is applied to the terminals A and AN of the converter. The terminal A is coupled to the base of a first bipolar junction transistor QN10, while the terminal AN is coupled to the base of a second bipolar junction transistor QN20. The collector of the transistor QN10 and the collector of the transistor QN20 are both coupled to a high voltage supply Vcc. The emitter of the transistor QN10 is coupled to a first terminal of a resistor R1. A second terminal of the resistor R1 is coupled to the base of a third bipolar junction transistor QN30, which is part of a first differential pair of transistors, and to a low voltage supply Vss through a current source $I_1$. The current source, $I_1$, is preferably comprised of an npn bipolar junction transistor T100 which is driven by a constant voltage $V_{BIAS}$ coupled to the base of the transistor T100. The emitter of the transistor QN20 is coupled to a first terminal of a resistor R2. A second terminal of the resistor R2 is coupled to the base of a fourth bipolar junction transistor QN40, which is also part of the first differential pair of transistors, and to the low voltage supply Vss through a second current source $I_2$. The current source $I_2$ is preferably comprised of an npn bipolar junction transistor T200 which is driven by the constant voltage $V_{BIAS}$ coupled to the base of the transistor T200. The emitters of the differential pair of transistors QN30 and QN40 are coupled together and tied to the low voltage supply Vss through a third current source $I_3$. The third current source $I_3$ preferably includes an npn bipolar junction transistor T300 which is driven by the constant voltage $V_{BIAS}$ coupled to the base of the transistor T300. The collectors of each transistor in the first differential pair QN30 and QN40 are both coupled to the high voltage supply Vcc. The collector of the transistor QN30 is coupled to the high voltage supply Vcc through a first node C and a resistor R3, while the collector of the transistor QN40 is coupled to the high voltage supply Vcc through a second node CN and a resistor R4. Together, all of these components (QN10, QN20, QN30, QN40, QN50, QN60 R1, R2, R3, R4, R5 and R7) make up a bipolar input stage which is designated by the broken lines 200.

In operation, when the incoming voltage signal at the terminal A is high and the incoming voltage signal at the terminal AN is low, the transistors QN10, QN20 and QN30 are turned on and the transistor QN40 is turned off. In this state, the voltage at the node C is driven low, while the voltage at the node CN is driven high. Conversely, when the incoming voltage signal at the terminal A is low and the incoming voltage signal at the terminal AN is high, the transistor QN30 is turned off and the transistors QN10, QN20 and QN40 are each turned on. In this state, the voltage at the node C is driven high, while the voltage at the node CN is driven low.

Referring again to FIG. 5, the base of a fifth bipolar junction transistor QN50 is coupled to the node CN, while the base of a sixth bipolar junction transistor QN60 is coupled to the node C. The collectors of each of the transistors QN50 and QN60 are coupled to the high voltage supply Vcc. In certain circumstances, these transistors QN50 and QN60 could be coupled to the high voltage supply Vcc through a PMOS transistor which would turn off for conserving power in a power down mode of operation. The emitter of the transistor QN50 is coupled to a first terminal of a resistor R5. A second terminal of the resistor R5 is coupled to the gate of a PMOS transistor P10, and the first terminal of a resistor R6. A second terminal of the resistor R6 is coupled to the gate of an NMOS transistor N10 and to the low voltage supply Vss through a current source $I_{b1}$. The current source $I_{b1}$ preferably includes a bipolar junction transistor T400 which is driven by the constant voltage $V_{BIAS}$ coupled to the base of the transistor T400. The emitter of the transistor QN60 is coupled to a first terminal of a resistor R7. A second terminal of the resistor R7 is coupled to the gate of a PMOS transistor P20 and the first terminal of a resistor R8. A second terminal of the resistor R8 is coupled to the gate of an NMOS transistor N20 and to the low voltage supply Vss through a current source $I_{b2}$. The current source $I_{b2}$ preferably includes a bipolar junction transistor T500 which is driven by the constant voltage $V_{BIAS}$ coupled to the base of the transistor.

As illustrated in FIG. 5, the source of the PMOS transistor P10 and the source of the PMOS transistor P20 are both coupled together and tied to the high voltage supply Vcc through a fourth current source $I_4$. The drain of the PMOS transistor P10 is coupled to the gate and the drain of an NMOS transistor N70 and the gate of an NMOS transistor N80. The source of the NMOS transistor N70, and the source of the NMOS transistor N80 are both coupled to the low voltage supply Vss. The drain of the PMOS transistor P20 is also coupled to the gate and the drain of an NMOS transistor N40 and the gate of an NMOS transistor N30. The source of the NMOS transistor N40 and the source of the NMOS transistor N30 are both coupled to the low voltage supply Vss. The drain of the NMOS transistor N30 is coupled to the output node OUT, while the drain of the NMOS transistor N80 is coupled to the inverted output node NOUT. Together, the transistors P10, N70 and N80 and the transistors P20, N30 and N40, form two separate current mirror circuits which are configured to sink current, however, not at the same time. When activated, the transistors P20, N30 and N40 function to sink current from the output node OUT, thereby decreasing the voltage level at the output node OUT. Likewise, when activated, the transistors P10, N70 and N80 function to sink current from the inverted output node NOUT, thereby decreasing the voltage level at the inverted output node NOUT. As will be described in further detail below, these separate current mirror circuits sink current from either the output node OUT or the inverted output node NOUT at any one time; but, will not sink current from both nodes at the same time.

The source of the NMOS transistor N10 and the source of the NMOS transistor N20 are both coupled together and tied to the low voltage supply Vss through a fifth current source $I_5$. The drain of the NMOS transistor N10 is coupled to the gate and the drain of a PMOS transistor P70, and the gate of a PMOS transistor P80. The source of the PMOS transistor P70 and the source of the PMOS transistor P80 are both coupled to the high voltage supply Vcc. The drain of the NMOS transistor N20 is also coupled to the gate and the drain of a PMOS transistor P40, and the gate of a PMOS transistor P30. The source of the PMOS transistor P40 and the source of the PMOS transistor P30 are each coupled to the high voltage supply Vcc. The drain of the PMOS transistor P30 is coupled to the output node OUT, while the drain of the PMOS transistor P80 is coupled to the inverted output node NOUT. The transistors N10, P70 and P80 and also N20 and P30, P40 form two separate current source circuits that are configured to be independently active such that they cannot source current at the same time. When activated, the transistors N20, P30 and P40 source current to the output node OUT, thereby increasing the voltage level at the output node OUT. Likewise, when activated, the transistors N10, P70 and P80 source current to the inverted output node NOUT, thereby increasing the voltage level at the inverted output node NOUT.

In short, FIG. 5 differs from the circuit depicted in FIG. 3 in two ways. First, the drain of the NMOS transistor N10 is longer tied directly to the high voltage supply Vcc through the dummy load L2. Instead, the drain of the NMOS transistor N10 is coupled to a second set of PMOS transistors P70 and P80. Second, the drain of the PMOS transistor P10 is no longer tied directly to the low voltage supply through the dummy load L1. Instead, the drain of the PMOS transistor P10 is coupled to a second set of NMOS transistors N70 and N80. The second set of PMOS transistors P70 and P80, along with the second set of NMOS transistors N70 and N80 are each coupled to the inverted output node NOUT.

Much like the operation of the circuit described in FIG. 3, in the alternative embodiment of FIG. 5, when the voltage at the node C is high and the voltage at the node CN is low (as discussed earlier, this occurs when the incoming voltage signal at the terminal A is low and the incoming voltage signal at the terminal AN is high), the transistors QN50 and QN60 level shift the differential voltage down by one Vbe plus a ΔV to the gate inputs of the NMOS transistors N10, N20 and the PMOS transistors P10, P20. In this state, the voltage at the gate of the PMOS transistor P20 increases while the voltage at the gate of the PMOS transistor P10 decreases. This turns the transistor P20 off, while drawing more current through the transistor P10 from the high voltage supply Vcc. As this occurs voltage at the gate of the NMOS transistor N80 increases. Meanwhile, the voltage at the gate of the NMOS transistor N20 is increased, while the voltage at the gate of the NMOS transistor N10 is decreased. This causes the NMOS transistor N10 to turn off, while causing the NMOS transistor N20 to draw more current from the high voltage supply Vcc, thereby activating the PMOS transistor P30. As the PMOS transistor P30 is activated, current is sourced down from the high voltage supply Vcc to the output node OUT, thereby causing the voltage at the output node OUT to increase. Alternately, a current sink is created as current is drawn down from the inverted output node NOUT through the NMOS transistor N70, thereby causing the voltage at the inverted output node NOUT to decrease.

Conversely, when the voltage at the node C is low and the voltage at the node CN is high (as discussed earlier, this occurs when the incoming voltage signal at the terminal A is high and the incoming voltage signal at the terminal AN is low), the transistors QN50 and QN60 level shift this differential voltage down by one Vbe plus a ΔV to the gate inputs of the NMOS transistors N10, N20 and the PMOS transistors P10, P20 . In this state, the voltage at the gate of the PMOS transistor P10 is increased, while the voltage at the gate of the PMOS transistor P20 is decreased. As the voltage at the gate of the PMOS transistor P10 is increased, the transistor turns off, and as the voltage at the gate of the PMOS transistor P20 is decreased, it becomes more active, drawing more current from the high voltage supply Vcc through the current source $I_4$. This condition causes the voltage at the gate of the NMOS transistor N30 to increase until it becomes active. Once active, the NMOS transistor N30 will sink current down from the output node OUT to the low voltage supply Vss.

Additionally, the voltage at the gate of the NMOS transistor N10 is increased causing the transistor to draw more current down from the high voltage supply Vcc. In this state, the voltage at the gate of the PMOS transistor P80 decreases as current is drawn down through the NMOS transistor N10, until the PMOS transistor P80 becomes active. When the PMOS transistor P80 becomes active, current is drawn down through from the high voltage supply Vcc to the inverted output node NOUT.

As has been described earlier, the circuit shown in FIG. 5 is designed to ensure that when current is sourced to the output node OUT, the same amount of current is sunk from the inverted output node NOUT. Likewise, when current is sourced to the inverted output node NOUT, the same amount of current is sunk from the output node OUT. At no time is current simultaneously sourced to both the output node OUT and the inverted output node NOUT and current is not simultaneously sunk from both the output node OUT and the inverted output node NOUT. The transistor turn-on and turn-off or threshold values and the biasing for the fourth and fifth current sources $I_4$ and $I_5$ are set to arrange the current sink and current source to be equal amounts of current, such that the voltage rise and drop at the output node OUT and the inverted output node NOUT remain constan. Thus, the duty cycle of the input signal will not experience significant duty cycle distortion at the output.

Figure 6:
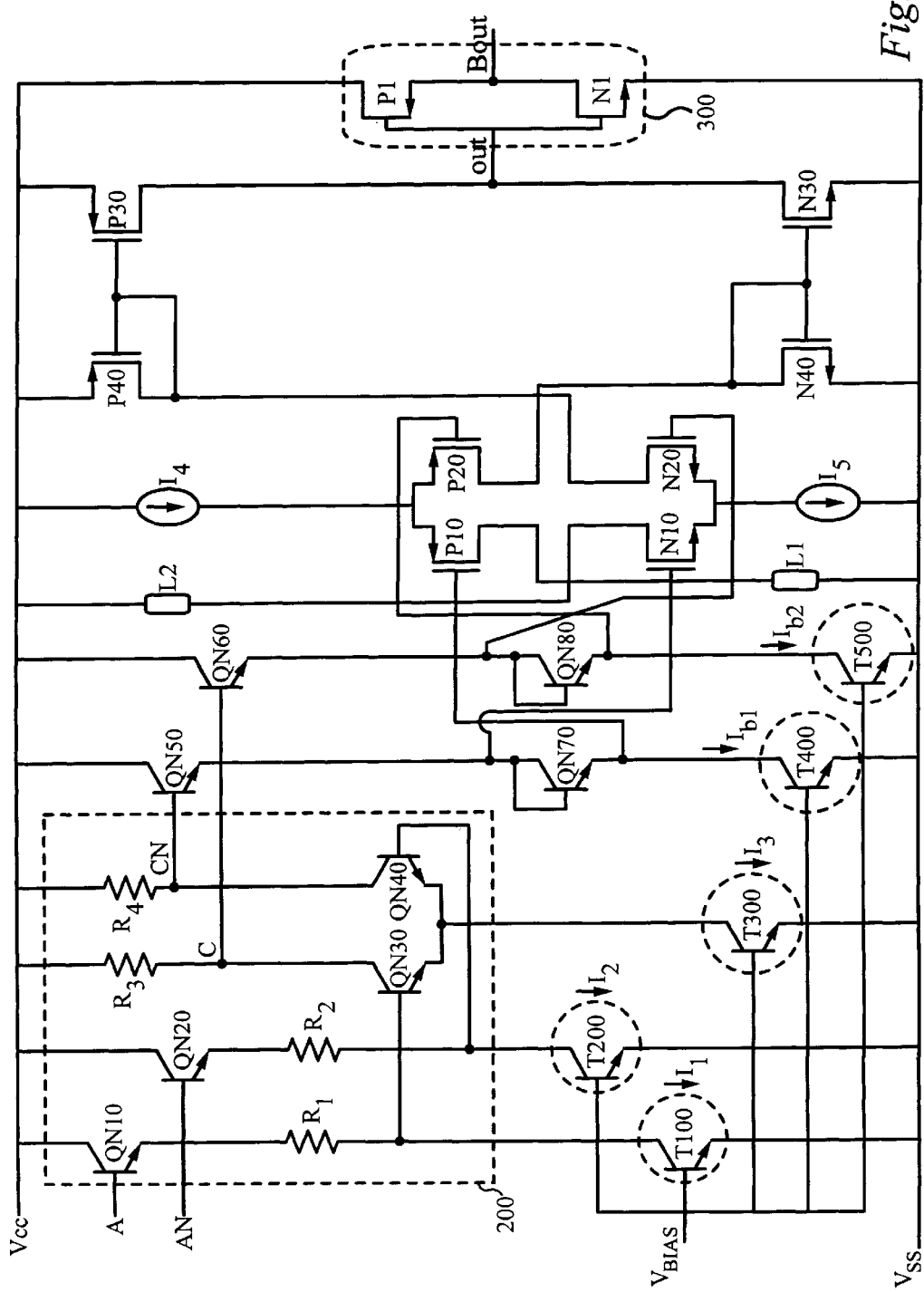
FIG. 6 illustrates a schematic diagram of a third alternative embodiment of the CML to CMOS converter of the present invention having a level shift arrangement which includes diodes.

FIG. 6 illustrates a schematic diagram of a third alternative embodiment of the CML to CMOS converter of the present invention having a level shift arrangement which includes diodes QN70 and QN80. The circuit illustrated in FIG. 6 differs from that illustrated in FIG. 3 in that the resistor R5 is omitted (replaced with a short) and the resistor R6 is replaced with an npn bipolar transistor QN70 configured as a diode such that its anode is coupled to the emitter of the transistor QN50 and to the gate of the NMOS transistor N10, and its cathode is coupled to the gate of the PMOS transistor P10 and to the current source $I_{b1}$. In addition, the resistor R7 is omitted (replaced with a short) and the resistor R8 is replaced with an npn bipolar transistor QN80 configured as a diode such that its anode is coupled to the emitter of the transistor QN60 and to the gate of the NMOS transistor N20 and its cathode is coupled to the gate of the PMOS transistor P20 and to the current source $I_{b2}$.

Figure 7A:
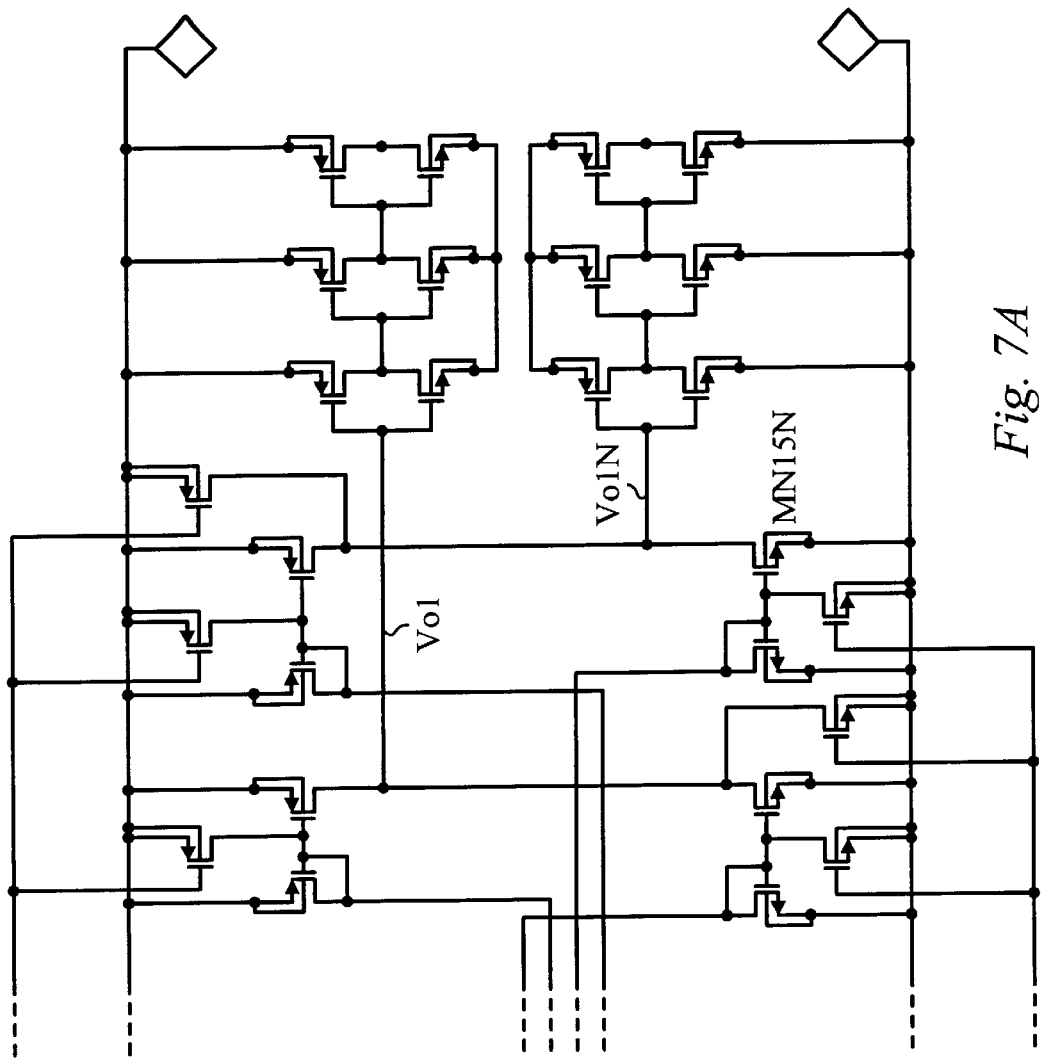
FIG. 7 shows a schematic diagram of a fourth alternative embodiment of the CML to CMOS converter of the present invention depicting an preferred biasing arrangement.
Figure 7B:
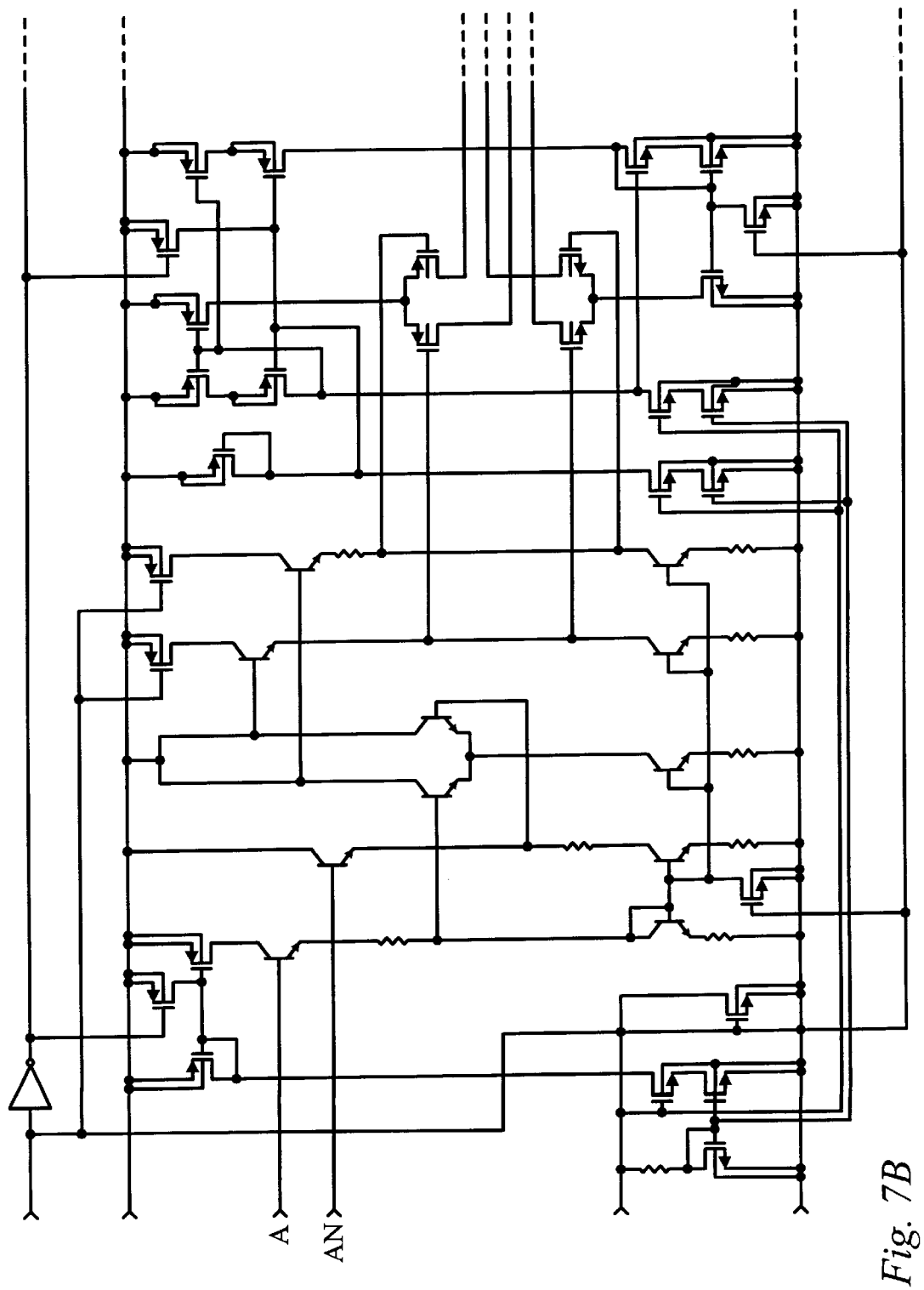

Finally, FIG. 7 shows a detailed schematic for an alternative embodiment of the CML to CMOS converter of the present invention. In FIG. 7, the NMOS transistors MN9 and MN10 perform the same functions as the NMOS transistors N10 and N20 described above in FIG. 5, the PMOS transistors MP1 IN and MP12N perform the same functions as the PMOS transistors P70 and P80 described above in FIG. 5, and the PMOS transistors MP11 and MP12 perform the same function as the PMOS transistors P40 and P30 described above in FIG. 5. Accordingly, the transistors MN10, MP11 and MP12 operate as a current source circuit for driving current to the output node VO1, while the transistors MN9, MP11N and MP12N operate as a current source circuit for driving current to the inverted output node V01N.

Additionally, in FIG. 7, the PMOS transistors MP9 and MP10 perform the same functions as the PMOS transistors P10 and P20 described above in FIG. 5. The NMOS transistors MN14 and MN15 perform the same functions as the NMOS transistors N30 and N40 described above in FIG. 5, while the NMOS transistors MN14N and MN15N perform the same function as the NMOS transistors N70 and N80 described above in FIG. 5. Accordingly, the transistors MP10, MN14 and MN15 operate as a current sink circuit for drawing current from the output node V01, while the transistors MP9, MN14N and MN15N operate as a current sink circuit for drawing current from the inverted output node VOIN.

The additional transistors which are shown in FIG. 7 reflect an optimal biasing configuration which may be utilized in order to further ensure that the amount of current driven to either output node V01 or V01N is equal to the amount of current drawn from such node, thereby creating an output voltage signal that has a symmetrical rise and fall time characteristic which translates to a constant duty cycle at either output node V01 or V01N.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components, current levels, and voltage levels disclosed herein.

What is claimed is:

1. A voltage converter comprising:
    a. an input stage for receiving an input voltage signal having a logic low level and a logic high level;
    b. an output node for forming a converted output voltage signal having a maximum voltage level and a minimum voltage level;
    c. a current source circuit coupled between the input stage and the output node, wherein the current source circuit increases the converted output voltage to the maximum voltage level at a steady rate whenever the input voltage signal changes from the logic low level to the logic high level, wherein the current source circuit includes a first pair of NMOS transistors coupled to the input voltage differential, and a first set of two PMOS transistors coupled between the first pair of NMOS transistors and the output node, and further wherein one transistor in the first pair of NMOS transistors is active when the input voltage signal is at the logic high level, thereby causing the set of two PMOS transistors to drive current at a steady source rate from a high voltage supply to the output node and increasing the converted output voltage at the output node; and
    d. a current sink circuit coupled between the input stage and the output node, wherein the current sink circuit decreases the converted output voltage to the minimum voltage level whenever the input voltage signal changes from the logic high level to the logic low level, and further wherein a rate of decrease in voltage level at which the current sink circuit decreases the converted output voltage is substantially equal to the steady rate at which the current source circuit increases the converted output voltage.

2. The voltage converter as claimed in claim 1, wherein the current sink circuit includes a first pair of PMOS transistors coupled to the input voltage differential, and a first set of two NMOS transistors coupled between the first pair of PMOS transistors and the output node, and further wherein one transistor in the first pair of PMOS transistors is active when the input voltage signal is at the logic low level, thereby causing the first set of two NMOS transistors to draw current at a steady sink rate from the output node to a low voltage supply and decreasing the converted output voltage at the output node.

3. A voltage converter comprising:
    a. an input stage for receiving an input voltage signal having a logic low and a logic high;
    b. an output node for forming a converted output voltage signal having a maximum voltage level and a minimum voltage level;
    c. a means for sourcing current to the output node coupled between the input stage and the output node for increasing the converted output voltage signal, wherein the means for sourcing current will source a steady amount of current to the output node thereby increasing the converted output voltage at a steady rate until the converted output voltage reaches a maximum voltage level whenever the input voltage signal changes from the logic low to the logic high, wherein the means for sourcing current to the output node includes a first pair of NMOS transistors coupled to the input voltage differential, and a first set of PMOS transistors coupled between the first pair of NMOS transistors and the output node, and further wherein one transistor in the first pair of NMOS transistors is active when the input voltage signal is at the logic high, thereby driving current from a high voltage supply through the first set of PMOS transistors to the output node and increasing the converted output voltage at the output node; and d. a means for sinking current from the output node coupled between the input stage and the output node for decreasing the converted output voltage signal, wherein the means for sinking current will sink a steady amount of current from the output node thereby decreasing the converted output voltage at a steady rate until the converted output voltage reaches a minimum voltage level whenever the input voltage signal changes from the logic high to the logic low, and further wherein the steady rate at which the converted output voltage decreases is equal to the steady rate at which the converted output voltage increases.

4. A voltage converter comprising:

a. an input stage for receiving an input voltage signal having a logic low and a logic high;

b. an output node for forming a converted output voltage signal having a maximum voltage level and a minimum voltage level;

c. a means for sourcing current to the output node coupled between the input stage and the output node for increasing the converted output voltage signal, wherein the means for sourcing current will source a steady amount of current to the output node thereby increasing the converted output voltage at a steady rate until the converted output voltage reaches a maximum voltage level whenever the input voltage signal changes from the logic low to the logic high;

d. a means for sinking current from the output node coupled between the input stage and the output node for decreasing the converted output voltage signal, wherein the means for sinking current will sink a steady amount of current from the output node thereby decreasing the converted output voltage at a steady rate until the converted output voltage reaches a minimum voltage level whenever the input voltage signal changes from the logic high to the logic low, and further wherein the steady rate at which the converted output voltage decreases is equal to the steady rate at which the converted output voltage increases, wherein the means for sinking current from the output node includes a first pair of PMOS transistors coupled to the input voltage differential, and a first set of NMOS transistors coupled between the first pair of PMOS transistors and the output node, and further wherein one transistor in the first pair of PMOS transistors is active when the input voltage signal is at the logic low, thereby drawing current from the output node through the first set of NMOS transistors to a low voltage supply and decreasing the converted output voltage at the output node.

5. A voltage converter for converting CML to CMOS comprising:

a. a bipolar input stage for receiving a CML level differential input voltage having a low logic level and a high logic level;

b. a converted output stage for outputting a CMOS level output voltage having a maximum voltage level and a minimum voltage level;

c. a current pump coupled between the bipolar input stage and the converted output stage, wherein the current pump either sources current to the converted output stage, thereby increasing the CMOS level output voltage to the maximum voltage level, or sinks current from the converted output stage thereby decreasing the CMOS level output voltage to the minimum voltage level, and further wherein an amount of current which is sourced by the current pump to the converted output stage is equal to an amount of current which is sunk from the converted output stage, wherein the maximum voltage level differs from a high voltage supply by a fixed voltage and the minimum voltage level differs from a low voltage supply by the same fixed voltage.

6. A voltage converter for converting CML to CMOS comprising:

a. a bipolar input stage for receiving a CML level differential input voltage having a low logic level and a high logic level;

b. a converted output stage for outputting a CMOS level output voltage having a maximum voltage level and a minimum voltage level;

c. a current pump coupled between the bipolar input stage and the converted output stage, wherein the current pump either sources current to the converted output stage, thereby increasing the CMOS level output voltage to the maximum voltage level, or sinks current from the converted output stage thereby decreasing the CMOS level output voltage to the minimum voltage level, and further wherein an amount of current which is sourced by the current pump to the converted output stage is equal to an amount of current which is sunk from the converted output stage wherein the current pump includes a first pair of NMOS transistors coupled to the bipolar input stage and a first set of PMOS transistors coupled between the first pair of NMOS transistors and the converted output stage, and further wherein one NMOS transistor in the first pair of NMOS transistors is active when the CML level differential input voltage is at the high logic level, causing the first set of PMOS transistors to source current from a high voltage supply to the converted output stage, thereby increasing the CMOS level output voltage to the maximum voltage level.

7. A voltage converter for converting CML to CMOS comprising:

a. a bipolar input stage for receiving a CML level differential input voltage having a low logic level and a high logic level;

b. a converted output stage for outputting a CMOS level output voltage having a maximum voltage level and a minimum voltage level;

c. a current pump coupled between the bipolar input stage and the converted output stage, wherein the current pump either sources current to the converted output stage, thereby increasing the CMOS level output voltage to the maximum voltage level, or sinks current from the converted output stage thereby decreasing the CMOS level output voltage to the minimum voltage level, and further wherein an amount of current which is sourced by the current pump to the converted output stage is equal to an amount of current which is sunk from the converted output stage, wherein the current pump includes a first pair of PMOS transistors coupled to the bipolar input stage and a first set of NMOS transistors coupled between the first pair of PMOS transistors and the converted output stage, and further wherein one PMOS transistor in the first pair of PMOS transistors is active when the CML level differential input voltage is high, causing the first set of NMOS transistors to sink current from the converted output stage to a low voltage supply, thereby decreasing the CMOS level output voltage to the minimum voltage level.

8. A voltage converter comprising:
   a. a high voltage supply;
   b. a low voltage supply;
   c. an input stage for receiving an input voltage signal having a high state and a low state;
   d. an output node for forming a converted output voltage having a maximum voltage level and a minimum voltage level;
   e. a first pair of NMOS transistors coupled between the input stage and a first set of PMOS transistors, which are further coupled between the high voltage supply and the output node, wherein one transistor in the first pair of NMOS transistors is active when the input voltage signal is in a high state, thereby causing the first set of PMOS transistors to drive current from the high voltage supply to the output node and increasing the converted output voltage at the output node to the maximum voltage level, and further wherein the first set of PMOS transistors will source current from the high voltage supply at a first fixed rate in order to increase the converted output voltage to the maximum voltage level within a predetermined time period whenever the input voltage signal is in a high state;
   f. a first pair of PMOS transistors coupled between the input stage and a first set of NMOS transistors, which are further coupled between the low voltage supply and the output node, wherein one transistor in the first pair of PMOS transistors is active when the input voltage signal is in a low state, thereby causing the first set of NMOS transistors to draw current from the output node to the low voltage supply and decreasing the converted output voltage at the output node to the minimum voltage level, and further wherein the first set of NMOS transistors will draw current from the output node at a second fixed rate in order to decrease the converted output voltage to the minimum voltage level whenever the input voltage differential is in a low state, and further wherein the second fixed rate at which the first set of NMOS transistors will draw current from the output node is equal to the first fixed rate at which the first set of PMOS transistors will source current to the output node.

9. The voltage converter as claimed in claim 8, wherein the maximum voltage level differs from the high voltage supply by a fixed voltage and the minimum voltage level differs from the low voltage supply by the same fixed voltage.

10. The voltage converter as claimed in claim 8, further comprising a complementary output node having an inverted output voltage level.

11. The voltage converter as claimed in claim 10, wherein the inverted output voltage at the complementary output node is equal to the inverse of the converted output voltage such that when the converted output voltage is increasing, the inverted output voltage at the complementary output node is decreasing and when the converted output voltage is decreasing, the inverted output voltage at the complementary output node is increasing.

12. A method of converting a differential logic signal into a single-ended logic signal, the voltage converter comprising:
   a. receiving the differential logic signal;
   b. charging an output node with a first current source having a first control node when the differential logic signal transitions from a logic low to a logic high whereby a voltage at the output node rises to a maximum voltage level, and discharging the output node with a second current source having a second control node when the differential logic signal transitions from the logic high voltage to the logic low voltage whereby a voltage at the output node falls to a minimum voltage level, wherein the first current source comprises a first PMOS transistor and a second PMOS transistor, each having a gate, a source and a drain wherein the source of each PMOS transistor is coupled to a high voltage supply, the gates of each PMOS transistor are coupled together, to the drain of the first PMOS transistor and to the first control node and wherein the drain of the second PMOS transistor is coupled to the output node, and further wherein the second current source comprises a first NMOS transistor and a second NMOS transistor, each having a gate, a source and a drain wherein the source of each NMOS transistor is coupled to a low voltage supply, the gates of each NMOS transistor are coupled together, to the drain of the first NMOS transistor and to the second control node and wherein the drain of the second NMOS transistor is coupled to the output node.

13. The method of claim 12, further including the steps of:
   a. discharging a complementary output node whenever the differential logic signal transitions from a logic low to a logic high whereby a voltage at the complementary output node falls to the minimum voltage level; and
   b. charging the complementary output node when the differential logic signal transitions from the logic high voltage to the logic low voltage whereby a voltage at the complementary output node rises to a maximum voltage level.

14. A voltage converter for converting a differential logic signal into a single-ended logic signal, the voltage converter comprising:
   a. input means for receiving the differential logic signal;
   b. conversion means coupled to the input means and responsive to the differential logic signal, wherein the conversion means charges an output node with a first current when the differential logic signal transitions from a logic low to a logic high, whereby a voltage at the output node rises to a first voltage level and further wherein the conversion means discharges the output node with a second current when the differential logic signal transitions from the logic high voltage to the logic low voltage whereby a voltage at the output node falls to a second voltage level, and further wherein the first voltage level is lower than a high voltage supply by a same amount that the second voltage is higher than a low voltage supply, wherein the conversion means includes a first pair of PMOS transistors, each having a drain, a gate and a source, wherein the sources of both PMOS transistors in the first pair are coupled to the high voltage supply, the gates of both PMOS transistors in the first pair are coupled to a first pair of NMOS transistors, and the drain of one PMOS transistor in the first pair is coupled to the output node, and further wherein one transistor in the first pair of NMOS transistors is active when the differential logic signal is at the logic high voltage, thereby driving current from the high voltage supply through the first pair of PMOS transistors to the output node and increasing the voltage at the output node.

15. A voltage converter for converting a differential logic signal into a single-ended logic signal, the voltage converter comprising:

a. input means for receiving the differential logic signal;

b. conversion means coupled to the input means and responsive to the differential logic signal, wherein the conversion means charges an output node with a first current when the differential logic signal transitions from a logic low to a logic high, whereby a voltage at the output node rises to a first voltage level and further wherein the conversion means discharges the output node with a second current when the differential logic signal transitions from the logic high voltage to the logic low voltage whereby a voltage at the output node falls to a second voltage level, and further wherein the first voltage level is lower than a high voltage supply by a same amount that the second voltage is higher than a low voltage supply, wherein the conversion means includes a second pair of NMOS transistors, each having a drain, a gate and a source, wherein the sources of both NMOS transistors in the second pair are coupled to the low voltage supply, the gates of both NMOS transistors in the second pair are coupled to a second pair of PMOS transistors, and the drain of one NMOS transistor in the second pair of NMOS transistors is coupled to the output node, and further wherein one transistor in the second pair of PMOS transistors is active when the differential logic signal is at the logic low voltage, thereby drawing current from the output node through the second pair of NMOS transistors to the low voltage supply and decreasing the voltage at the output node.

\* \* \* \* \*

UNITED STATES PATENT AND TRADEMARK OFFICE
CERTIFICATE OF CORRECTION

PATENT NO. : 6,211,699 B1
DATED : April 3, 2001
INVENTOR(S) : Douglas Sudjian

It is certified that error appears in the above-identified patent and that said Letters Patent is hereby corrected as shown below:

Column 5,
Line 67, replace "a third current source, $l_3$" with -- a third current source, $I_3$ --.

Column 6,
Line 1, replace the first word "$l_3$" with -- $I_3$ --.

Column 7,
Line 2, replace "load Li" with -- load L1 --.

Column 11,
Line 30, replace "NMOS transistor N1O" with -- NMOS transistor N10 --.

Column 13,
Line 29, replace "MP1 IN" with -- MP11N --.
Line 52, replace the only word "VOIN" with -- V01N --.

Signed and Sealed this

Sixth Day of November, 2001

Attest:

*Nicholas P. Godici*

NICHOLAS P. GODICI
*Attesting Officer*     *Acting Director of the United States Patent and Trademark Office*